(12) United States Patent
Younis et al.

(10) Patent No.: US 7,978,118 B1
(45) Date of Patent: Jul. 12, 2011

(54) ALGORITHMIC ANALOG-TO-DIGITAL CONVERSION

(75) Inventors: Ahmed Abdell-Ra'oof Younis, San Antonio, TX (US); Michael A. Nix, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 12/697,789

(22) Filed: Feb. 1, 2010

(51) Int. Cl.
*H03M 1/34* (2006.01)

(52) U.S. Cl. ......................................... 341/163; 341/155

(58) Field of Classification Search .................. 341/163, 341/155, 161, 156
See application file for complete search history.

(56) References Cited

U.S. PATENT DOCUMENTS

| | | | |
|---|---|---|---|
| 6,195,032 B1 * | 2/2001 | Watson et al. | 341/162 |
| 6,967,611 B2 * | 11/2005 | Atriss et al. | 341/172 |
| 7,068,202 B2 | 6/2006 | Waltari | |
| 7,714,762 B2 * | 5/2010 | Poon et al. | 341/161 |
| 7,868,864 B2 * | 1/2011 | Hsieh | 345/89 |
| 2010/0109924 A1 * | 5/2010 | Cho et al. | 341/118 |

OTHER PUBLICATIONS

Dave Treleaven, "1.5-Bit stages in Pipeline ADCs," May 11, 2006, Penton Media, Inc., accessed Dec. 2, 2009 at electronicdesign.com/Articles/Print.cfm?ArticleID-12451.

* cited by examiner

*Primary Examiner* — Peguy JeanPierre

(57) ABSTRACT

A 1.5-bit algorithmic analog-to-digital converter (ADC) generates a digital value representative of an input voltage. The ADC implements a series of conversion cycles for a conversion operation. Each conversion cycle has three sub-cycles: a scaling sub-cycle, a first sample sub-cycle, and a second sample sub-cycle. In the scaling sub-cycle, the residual voltage from the previous conversion cycle is doubled to generate a first voltage. In the first sample sub-cycle, a first bit of a corresponding bit pair is determined based on the polarity of the first voltage. The first voltage is either increased or decreased by a reference voltage based on the polarity of the first voltage to generate a second voltage. In the second sample sub-cycle, a second bit of the corresponding bit pair is determined based on the polarity of the second voltage. The second voltage then is either increased or decreased by the reference voltage based on the polarity of the second voltage to generate the residual voltage used for the next conversion cycle in the series. Each bit pair is mapped to a corresponding two-bit code value and the resulting code values are used to generate the digital value.

20 Claims, 4 Drawing Sheets

US 7,978,118 B1

ALGORITHMIC ANALOG-TO-DIGITAL CONVERSION

FIELD OF THE DISCLOSURE

The present disclosure relates generally to analog-to-digital conversion and more particularly to algorithmic analog-to-digital conversion.

BACKGROUND

Algorithmic analog-to-digital converters (ADCs) often are used in low speed, high resolution applications in which power and silicon area are at a premium. In a typical implementation, a conventional algorithmic ADC uses the same conversion stage circuitry over a number of conversion cycles to produce a digital value representative of an input voltage. Conventional 1-bit algorithmic ADCs that generate one bit of the output digital value per conversion cycle are particularly susceptible to voltage offsets. To provide improved resilience to voltage offsets, circuit designers increasingly are implementing 1.5-bit algorithmic ADCs that generate the equivalent of approximately 1.5 bits of information for the output digital value per conversion cycle. These conventional 1.5-bit algorithmic ADCs define three voltage regions and each conversion cycle results in an output of a two-bit code that identifies the particular one of the three voltage regions in which the sampled voltage for the conversion cycle is found. The two-bit digital codes from the conversion cycles are combined to generate the output digital value.

Conventional 1.5-bit algorithmic ADC architectures employ two comparators to define the three voltage regions. Comparators require relatively large amounts of power and silicon area to implement. Moreover, the input signal being converted to a digital value often is a differential signal, thereby requiring the use of two differential difference comparators, which are complex to implement and often malfunction in the event that the common mode voltage of a reference voltage used to define the three voltage regions differs from the common mode voltage of the input signal. As such, conventional 1.5-bit algorithmic ADCs provide improved resilience to voltage offsets at the cost of increased complexity, power consumption, and silicon area.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-4 illustrate a 1.5-bit algorithmic analog-to-digital converter (ADC) for generating a digital value representative of the voltage of an analog input signal. The ADC implements a conversion stage that is reused over a series of conversion cycles of a conversion operation. Each conversion cycle of the series has three sub-cycles: a scaling sub-cycle, a first sample sub-cycle, and a second sample sub-cycle. In the scaling sub-cycle, the magnitude of the residual voltage from the previous conversion cycle (or the voltage of the input signal for the initial conversion cycle in the series) is doubled or otherwise scaled to generate a first voltage for the conversion cycle. In the first sample sub-cycle, a first bit of a corresponding bit pair for the conversion cycle is determined by a single comparator based on the polarity of the first voltage. The first voltage then is either increased or decreased by a reference voltage based on the polarity of the first voltage to generate a second voltage. In the second sample sub-cycle, a second bit of the corresponding bit pair is determined by the same single comparator based on the polarity of the second voltage. The second voltage then is either increased or decreased by the reference voltage based on the polarity of the second voltage to generate the residual voltage used for the next conversion cycle in the series. Each bit pair of the sequence of bit pairs resulting from the series of conversion cycles is mapped to a corresponding two-bit code value. The resulting code values then are combined through a sequence of shift-and-add operations or exclusive-OR operations to generate the digital value representative of the voltage of the input signal.

The generation of the two-bit code values, each of which represents approximately 1.5 bits of information for the resulting digital value, builds redundancy into the information generated at each conversion cycle and thus the improved 1.5-bit algorithmic ADC architecture described herein provides improved resiliency to voltage offsets often afforded by conventional 1.5-bit ADC architectures. Further, through the use of the two sample sub-cycles in each conversion cycle as described herein, this improved 1.5-bit algorithmic ADC architecture requires the use of only one differential comparator for the conversion stage, thereby avoiding the increased power consumption, complexity, and silicon area often resulting from the use of two comparators in conventional 1.5-bit ADC architectures. Moreover, the improved 1.5-bit algorithmic ADC architecture does not require the use of a differential difference comparator, thereby further reducing the complexity of implementation compared to conventional differential 1.5-bit ADC architectures.

Figure 1:
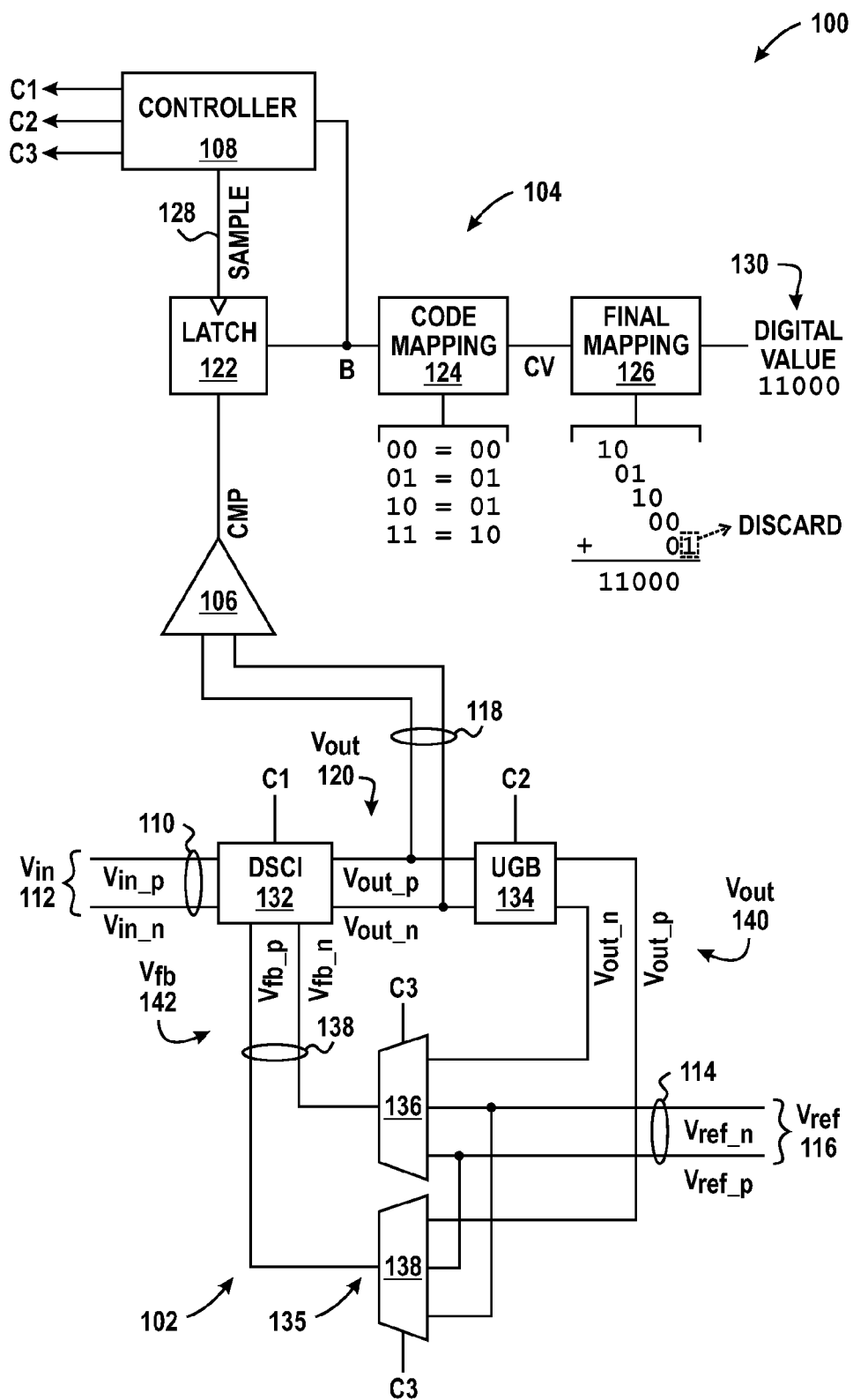
FIG. 1 is a diagram illustrating a 1.5-bit algorithmic analog-to-digital converter (ADC) in accordance with at least one embodiment of the present disclosure.

FIG. 1 illustrates a 1.5-bit algorithmic ADC 100 in accordance with at least one embodiment of the present disclosure. The ADC 100 can be used in any of a variety of systems. To illustrate, because of the relatively low complexity and power required to implement the ADC 100, the ADC 100 may find beneficial use in, for example, temperature control systems of processor devices whereby the ADC 100 is used to convert the analog output of a temperature sensor to a corresponding digital value. In one embodiment, some or all of the components of the ADC 100 can implemented in a processing device designed based on a set of register-transfer-level (RTL) or Verilog instructions that define the functionality of the processing device and which are synthesized to generate the electrical and electronic design of the processing device.

In the depicted example, the ADC 100 includes a scaling unit 102, a code conversion unit 104, a comparator 106, and a controller 108. The scaling unit 102 includes an input 110 to receive an input signal 112, an input 114 to receive a reference voltage 116, and an output 118 to provide an output voltage 120. The input signal 112 is a differential signal comprising a positive voltage component $V_{in\_p}$ and a negative voltage component $V_{in\_n}$, whereby the difference between the voltage components $V_{in\_p}$ and $V_{in\_n}$ is the voltage $V_{in}$ of the input signal 112. The reference voltage 116 is a differential signal comprising a positive voltage component $V_{ref\_p}$ and a negative voltage component $V_{ref\_n}$, whereby the difference between the voltage components $V_{ref\_p}$ and $V_{ref\_n}$ is the voltage $V_{ref}$ of the reference voltage 116. In at least one embodiment, the voltage $V_{ref}$ for the reference voltage 116 can be selected as one-fourth of the input voltage range $V_{max}$ of the ADC 100, that is, $V_{ref}=V_{max}/4$, where $V_{in}$ ranges from $-V_{max}$ to $+V_{max}$. The output voltage 120 is a differential signal comprising a positive voltage component $V_{out\_A}$, and a negative voltage component $V_{out\_n}$, whereby the difference between the voltage components $V_{out\_p}$ and $V_{out\_n}$ is the voltage $V_{out}$ of the output voltage 120.

The comparator 106 comprises a differential comparator having an input to receive the positive and negative voltage components of the output voltage 120 and an output to provide a value CMP (e.g., a logic "1" or a logic "0") representative of the polarity of the output voltage 120. For example, when the voltage $V_{out}$, is positive (greater than or equal to zero), the comparator 106 provides an output of logic "1" and when the voltage $V_{out}$ is negative (less than zero), the comparator 106 provides an output of logic "0."

The code conversion unit 104 includes a latch 122, a code mapping unit 124, and a final mapping unit 126. The latch 122 includes a data input coupled to the output of the comparator 106, a sample input to receive a sample signal 128, and an output to provide a bit value B, whereby the latch 122 latches the bit value B to the value CMP of the comparator 106 in response to an assertion of the sample signal 128. The code mapping unit 124 is configured to receive the sequence of bit values B output by the latch 122 and, for each bit pair in the sequence, map the bit pair to a corresponding two-bit code value CV, such that the sequence of bit values B generated during an analog-to-digital conversion operation is converted to a sequence of mapped code values. As noted above, conventional 1.5 bit algorithmic ADCs implement two comparators and two reference voltages so as to define three voltage regions. The ADC 100 described herein also can be understood to define three voltage regions: $<-V_{ref}$; $-V_{ref}$ to $+V_{ref}$; and $>+V_{ref}$. Accordingly, the code mapping unit 124 maps the four possible values of a corresponding bit pair to one of three code values, where each of the three code values represents one of the three voltage regions. In one embodiment, the code mapping unit 124 achieves this mapping by adding the two bits of the bit pair to generate the corresponding code value. To illustrate, the bit pair "00" is mapped to the code value "00" (i.e., 0+0=00), the bit pairs "01" and "10" are mapped to the code value "01" (i.e., 0+1=1+0=01), and the bit pair "11" is mapped to the code value "10" (i.e., 1+1=10).

The final mapping unit 126 includes an input to receive the code values generated by the code mapping unit 124 and an output to provide a digital value 130 representative of the voltage $V_{in}$ of the input signal 112 at the time of conversion. The final mapping unit 126 operates to convert the sequence of code values generated for the conversion operation into the corresponding digital value 130 such that the two bits of information in each code value are converted to a single bit of the digital value 130. In one embodiment, the final mapping unit 126 includes a series connection of adders and shift registers or other logic so that the two-bit code values from each conversion cycle are added together with 1 bit overlapped between code values of adjacent conversion cycles. In one embodiment, the most significant bit (MSB) of the digital value 130 is the first bit of the first code value generated in the conversion process. Subsequent bits of the digital value 130 are the exclusive-OR of the bits of the code value of the previous conversion cycle and the first bit of the present conversion cycle. For a five-bit result, this operation can be represented by the following pseudocode, whereby Data_Value(X) is the Xth bit of the data value 130 and code_val_Y_Z is the Zth (first or second) bit of the code value of the Yth conversion cycle:

Data_Value(4)=XOR(0, 0, code_val__1__1)
Data_Value(3)=XOR(code_val__1__1, code_val__1__2, code_val__2__1)
Data_Value(2)=XOR(code_val__2__1, code_val__2__2, code_val__3__1)
Data_Value(1)=XOR(code_val__3__1, code_val__3__2, code_val__4__1)
Data_Value(0)=XOR(code_val__4__1, code_val__4__2, code_val__5__1)

As reflected by the algorithm above, the least significant bit (LSB) of the resulting digital value 130 typically is dropped as overhead. As illustrated in FIG. 1, for a code value sequence of "10", "01", "10", "00", and "01" (from initial conversion cycle to last conversion cycle), the resulting digital value 130 under the conversion algorithm described above would be "110001", or "11000" once the LSB is dropped as overhead.

The controller 108 uses control signals (e.g., control signals C1, C2, and C3) to control the operation of the scaling unit 102 so that the conversion operation for converting the voltage $V_{in}$ of the input signal 112 to the digital value 130 is implemented as a series of conversion cycles, each conversion cycle generating a corresponding bit pair. As described above, each bit pair is then mapped to a corresponding code value and the resulting sequence of code values is combined in a manner to generate the digital value 130. In one embodiment, the controller 108 controls the operation of the scaling unit 102 and the latch 122 so as to implement three sub-cycles for each conversion cycle: a scaling sub-cycle, a first sample sub-cycle, and a second sample sub-cycle. In the scaling sub-cycle, the controller 108 controls the scaling unit 102 so as to double the residual voltage from the previous conversion cycle (or the voltage $V_{in}$ of the input signal 112 for the initial conversion cycle in the series) so as to generate a first voltage for the conversion cycle, whereby the scaling unit 102 provides the first voltage as the output voltage 120. The comparator 106 configures its output CMP based on the polarity of the first voltage (as the output voltage 120) and the controller 108 asserts the sample signal 128 so that the latch 122 captures the value CMP (and thus the polarity of the first voltage) as bit B1 of the bit pair [B1B0] of the corresponding conversion cycle. The controller 108 then directs the scaling unit 102 to either increase the first voltage by the reference voltage 116 or decrease the first voltage by the reference voltage 116 based on the value CMP (and thus based on based on the polarity of the first voltage) so as to generate a second voltage, whereby the scaling unit 102 provides the second voltage as the output voltage 120. As with the first sample sub-cycle, in the second sample sub-cycle the comparator 106 configures its output CMP based on the polarity of the second voltage (as the output voltage 120) and the controller 108 asserts the sample signal 128 so that the latch 122 captures the value CMP (and thus the polarity of the second voltage) as bit B0 of the bit pair [B1B0] of the corresponding conversion cycle. The controller 108 then directs the scaling unit 102 to either increase the second voltage by the reference voltage 116 or decrease the second voltage by the reference voltage 116 based on the value CMP (and thus based on based on the polarity of the second voltage) so as to generate the residual voltage that is to be used for the next conversion cycle in the series of conversion cycles.

In one embodiment, the scaling sub-cycle of each conversion cycle is implemented by doubling the voltage to be scaled. FIG. 1 illustrates a particular implementation of the scaling unit 102 that achieves the doubling of the voltage to be scaled by adding the voltage to itself through the use of a switched-capacitor integrator and a unity-gain sample-and-hold buffer. Although an example implementation is described below whereby the scaling is achieved through addition of the voltage to itself, the scaling of the scaling sub-cycle of each conversion cycle alternatively can be implemented using a multiplier or other voltage scaling circuitry in accordance with the teachings provided herein and without departing from the scope of the present disclosure.

In the depicted example, the scaling unit 102 includes a differential switched capacitor integrator (DSCI) unit 132, a unity-gain sample-and-hold buffer 134 (referred to herein as unity-gain buffer 134), and a multiplexing unit 135 comprising multiplexers 136 and 138. The unity-gain buffer 134 includes an input to receive the output voltage 120 and an output to provide a buffered output voltage 140, whereby the unity-gain buffer 134 changes its output subject to the control signal C2 from the controller 108. The buffered output voltage 140 includes a positive voltage component $V_{out\_p}$ and a negative voltage component $V_{out\_n}$ that are equal to the positive voltage component $V_{out\_p}$ and the negative voltage component $V_{out\_n}$, respectively, of the output voltage 120.

The multiplexer 136 includes a first input to receive the negative voltage component $V_{out\_n}$ of the buffered output voltage 140, a second input to receive the negative voltage component $V_{ref\_n}$ of the reference voltage 116, a third input to receive the positive voltage component $V_{ref\_p}$ of the reference voltage 116, and an output to provide one of these three voltage components as the negative voltage component $V_{fb\_n}$ of a feedback voltage 142 (also identified herein as feedback voltage $V_{fb}$) based on the control signal C3. The multiplexer 138 includes a first input to receive the positive voltage component $V_{out\_p}$ of the buffered output voltage 140, a second input to receive the positive voltage component $V_{ref\_p}$ of the reference voltage 116, a third input to receive the negative voltage component $V_{ref\_n}$ of the reference voltage 116, and an output to provide one of these three voltage components as the positive voltage component $V_{fb\_p}$ of the feedback voltage 142 based on the control signal C3. As such, the feedback voltage 142 is represented by the difference between the positive voltage component $V_{fb\_p}$ and the negative voltage component $V_{fb\_n}$ and thus the controller 108 can manipulate the multiplexing unit 135 to provide one of the voltages $V_{out}$, $+V_{ref}$, or $-V_{ref}$ as the feedback voltage 142.

The DSCI unit 132 includes an input coupled to the input 110 to receive the input signal 112, an input 138 to receive the feedback voltage 142, and an output coupled to the output 118 to provide the output voltage 120. The DSCI unit 132 operates in cycles controlled by the control signal C1, whereby for each cycle the DSCI unit 132 adds the received feedback voltage $V_{fb}$ to the voltage generated from the previous cycle and outputs the resulting voltage as the output voltage 120.

In the illustrated implementation, the controller 108 can configure the control signals C1-C3 so as to implement the three sub-cycles of each conversion cycle as described above. During the scaling sub-cycle, the controller 108 configures the control signals C1-C3 so that the multiplexers 136 and 138 provide the buffered output voltage 140 as the feedback voltage 142 (that is, $V_{fb}=V_{out}$) so that the DSCI unit 132, in effect, doubles the output voltage 120 by adding the output voltage 120 to itself. In this manner, the scaling unit 102 achieves the doubling of the residual voltage for the scaling sub-cycle of the conversion cycle. During the first sampling sub-cycle and the second sampling sub-cycle, the controller 108 configures the scaling unit 102 to selectively increase or decrease the corresponding sub-cycle voltage by the reference voltage $V_{ref}$ based on the latched bit value at the latch 122 by manipulating the multiplexing unit 135 to provide either the voltage $+V_{ref}$ or the voltage $-V_{ref}$ as the feedback voltage 142 and thus causing the DSCI unit 132 to adjust the output voltage 120 by either $+V_{ref}$ or $-V_{ref}$ for the next sub-cycle based on the polarity of the output voltage 120 at the current sub-cycle.

Figure 2:
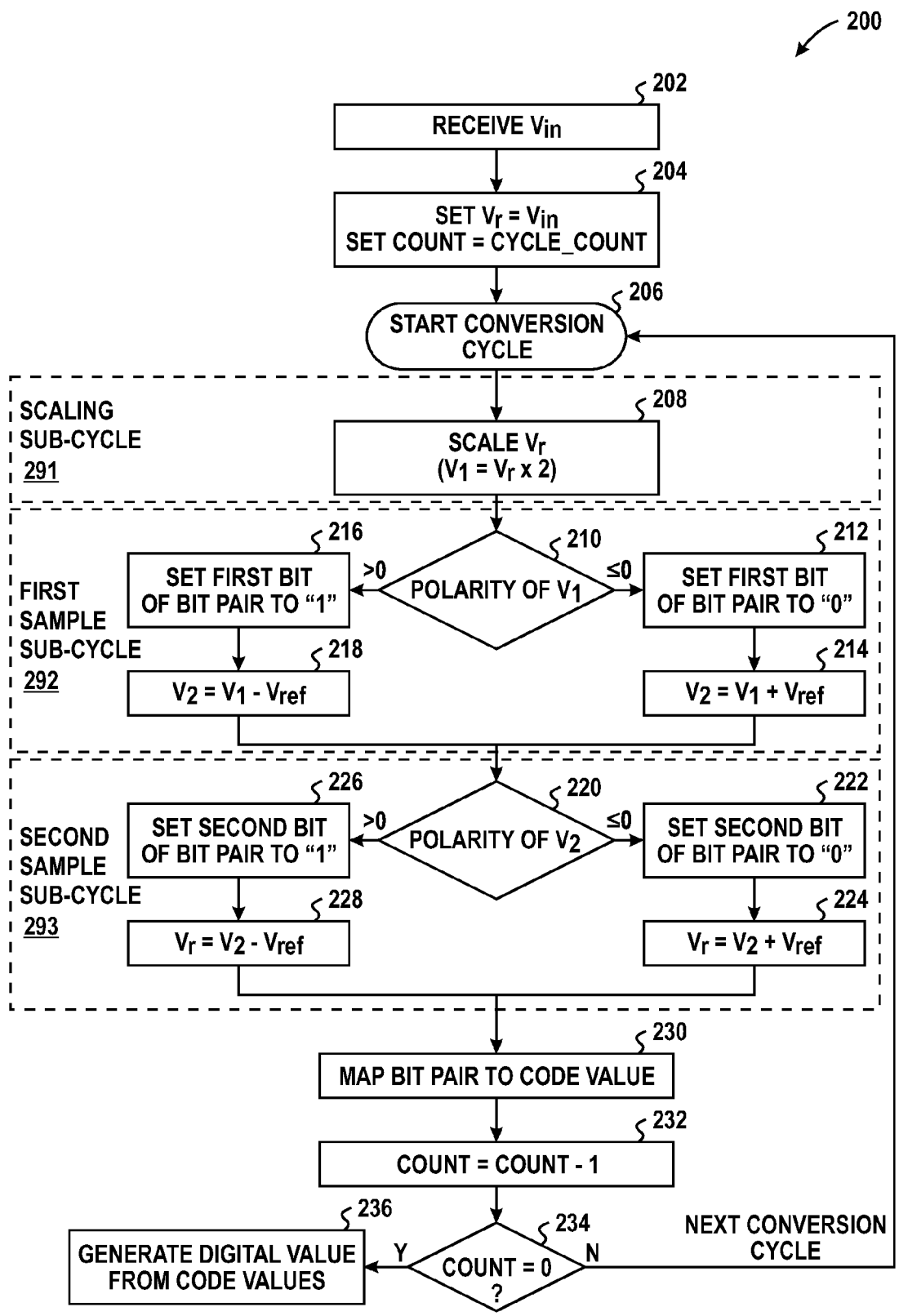
FIG. 2 is a flow diagram illustrating an example method of operation of the 1.5-bit algorithmic ADC of FIG. 1 in accordance with at least one embodiment of the present disclosure.

FIG. 2 illustrates an example method 200 of operation of the ADC 100 of FIG. 1 in accordance with at least one embodiment of the present disclosure. The method 200 initiates at block 202 whereby the input signal 112 having a voltage $V_{in}$ is received and the conversion operation commences. At block 204, the scaling unit 102 sets the residual voltage ($V_R$) to be used for the initial conversion cycle to the voltage $V_{in}$ of the input signal 112 and initially sets a Count value of a counter (not shown) of the controller 108 to a value Cycle_Count, which represents the number of conversion cycles to be implemented in the conversion operation. As such, the value Cycle_Count represents the resolution of the ADC 100. The value Cycle_Count can be set or programmed based on any of a variety of criteria, such as desired resolution, maximum conversion time, and the like.

At block 206 the controller 108 initiates the initial, or next, conversion cycle in the series. As noted above, each conversion cycle includes a scaling sub-cycle (illustrated as scaling sub-cycle 291), a first sample sub-cycle (illustrated as first sample sub-cycle 292), and a second sample sub-cycle (illustrated as second sample sub-cycle 293). For the scaling sub-cycle 291 of the current conversion cycle, the controller 108, at block 208, configures the scaling unit 102 to double the residual voltage ($V_R$) from the previous conversion cycle to generate the first voltage ($V_1$) for the current conversion cycle. As described above, this scaling can be achieved by controlling scaling unit 102 so that the DSCI unit 132 adds the buffered output voltage 140 from the unity-gain buffer 134 to the output voltage 120 provided by the DSCI unit 132, thereby effectively doubling the output voltage 120. Alternately, a multiplying amplifier or other multiplying circuitry can be implemented to achieve the doubling of the residual voltage.

After scaling the residual voltage $V_R$ to generate the first voltage (that is, $V_1=2\times V_R$), the controller 108 begins the first sampling sub-cycle 292. At block 210, the comparator 106 configures the output CMP to reflect the polarity of the first voltage $V_1$ and the controller 108 asserts the sample signal 128 to latch the output CMP of the comparator 106. In response to the comparator 106 having an output CMP of "0", and thereby indicating that the first voltage $V_1$ has a negative polarity, the latch 122 provides a bit value of "0" for the first bit B1 of the bit pair [B1B0] for the current conversion cycle at block 212 and at block 214 the controller 108 configures the multiplexing unit 135 to provide the voltage $+V_{ref}$ as the feedback voltage $V_{fb}$ so that the scaling unit 102 increases the first voltage $V_1$ by the reference voltage $V_{ref}$ to generate the second voltage $V_2$ (i.e., $V_2=V_1+V_{ref}$). In response to the comparator 106 having an output CMP of "1", and thereby indicating that the first voltage $V_1$ has a positive polarity, the latch 122 provides a bit value of "1" for the first bit B1 of the bit pair [B1B0] for the current conversion cycle at block 216 and at block 218 controller 108 configures the multiplexing unit 135 to provide the voltage $-V_{ref}$ as the feedback voltage $V_{fb}$ so that the scaling unit 102 decreases the first voltage $V_1$ by the reference voltage $V_{ref}$ to generate the second voltage $V_2$ (i.e., $V_2=V_1-V_{ref}$).

The second sample sub-cycle 293 is initiated at block 220 whereby the comparator 106 configures the output CMP to reflect the polarity of the second voltage $V_2$ and the controller 108 asserts the sample signal 128 to latch the output CMP of the comparator 106. In response to the comparator 106 having an output CMP of "0", and thereby indicating that the second voltage $V_2$ has a negative polarity, the latch 122 provides a bit value of "0" for the second bit B0 of the bit pair [B1B0] for the current conversion cycle at block 222 and at block 224 the controller 108 configures the multiplexing unit 135 to provide the voltage $+V_{ref}$ as the feedback voltage $V_{fb}$ so that the scaling unit 102 increases the second voltage $V_2$ by the reference voltage $V_{ref}$ to generate the residual voltage $V_R$ to be used for the next conversion cycle (i.e., $V_R = V_2 + V_{ref}$). In response to the comparator 106 having an output CMP of "1", and thereby indicating that the second voltage $V_2$ has a positive polarity, the latch 122 provides a bit value of "1" for the second bit B0 of the bit pair [B1B0] for the current conversion cycle at block 226 and at block 228 the controller 108 configures the multiplexing unit 135 to provide the voltage $-V_{ref}$ as the feedback voltage $V_{fb}$ so that the scaling unit 102 decreases the second voltage $V_2$ by the reference voltage $V_{ref}$ to generate the residual voltage $V_R$ for the next conversion cycle (i.e., $V_R = V_2 \ V_{ref}$).

At block 230, the code mapping unit 124 maps the bit pair [B1B0] generated at the completion of the second sample sub-cycle 293 to the corresponding two-bit code value as described above. At block 232 the controller 108 decrements the Count value by 1 to reflect the completion of the current conversion cycle. At block 234, the controller 108 determines whether the Count value is at zero, thereby indicating completion of the each conversion cycle of the series for the conversion operation. If the Count value is not yet zero, one or more conversion cycles in the series remain and thus the method 200 returns to block 206 for another iteration of the scaling sub-cycle 291, the first sample sub-cycle 292, and the second sample sub-cycle 293 for the next conversion cycle in the series.

Returning to block 234, if the Count value has reached zero, then the series of conversion cycles has completed. Accordingly, at block 236 the final mapping unit 126 completes the conversion of the sequence of code values generated through the series of conversion cycles to the digital value 130 representing the voltage $V_{in}$ of the input signal 112 received at block 202. In one embodiment, the shift-and-add operations used to generate the digital value 130 from the sequence of code values are performed in parallel with the conversion cycle operation such that each code value is incorporated into the digital value 130 as the code value is generated. Alternatively, the sequence of code values can be buffered until the series of conversion cycles is completed, at which point the process of converting the sequence of code values to the digital value 130 is performed.

Figure 3:
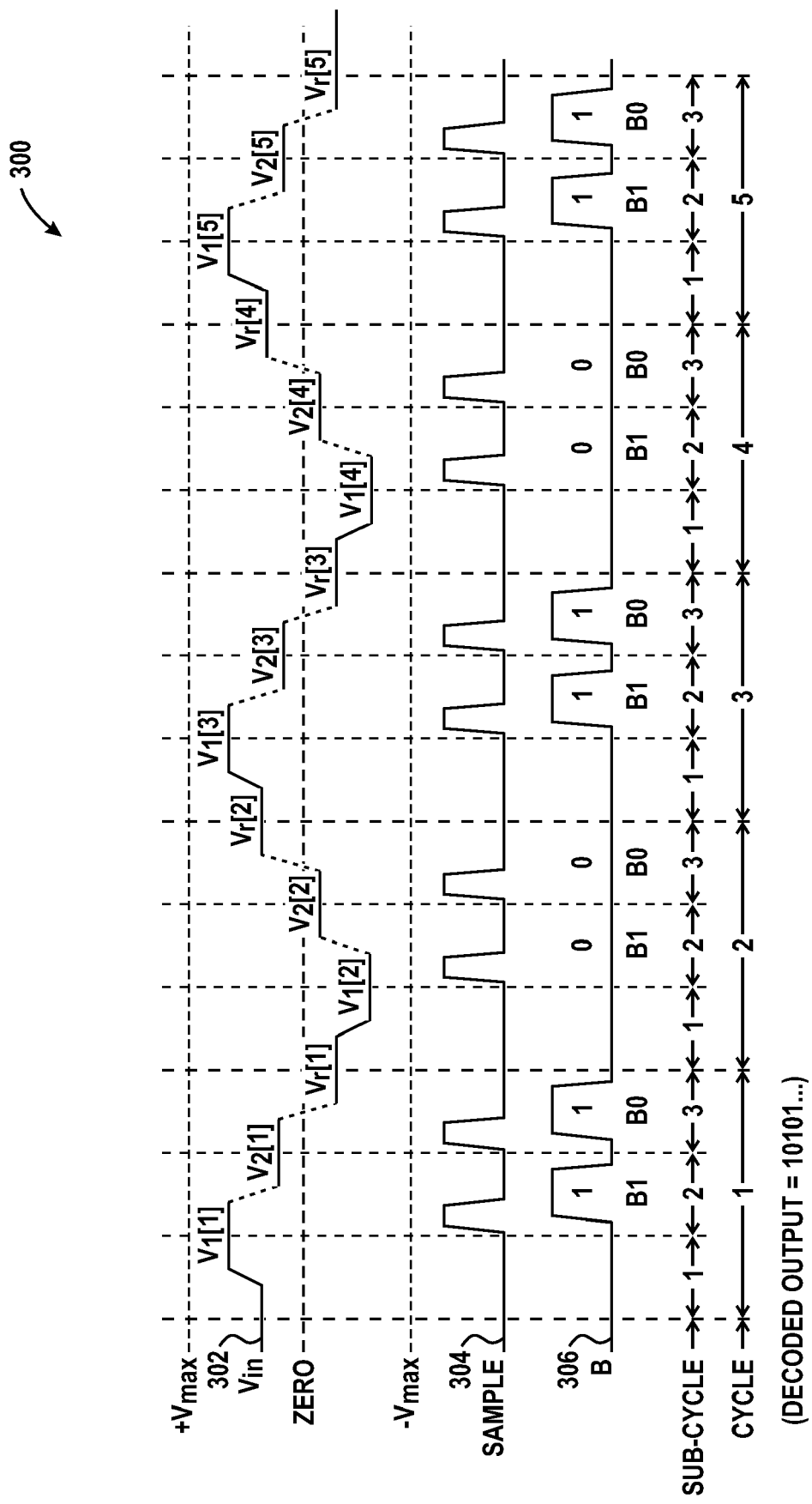
FIG. 3 is a flow diagram illustrating an example operation of the 1.5-bit algorithmic ADC of FIG. 1 for an input signal having a positive polarity in accordance with at least one embodiment of the present disclosure.

FIG. 3 illustrates an example of the method 200 in an instance whereby the voltage $V_{in}$ of the input signal 112 has a positive polarity and is approximately two-thirds of the full-scale of the ADC 100, whereby the full-scale is from $-V_{max}$ to $+V_{max}$. For chart 300, the conversion process occurs over five conversion cycles (Cycle_Count=5), which are identified as "cycle 1"–"cycle 5", respectively. As depicted, each conversion cycle includes the scaling sub-cycle, the first sampling sub-cycle, and the second sampling sub-cycle (identified in chart 300 as sub-cycles 1, 2, and 3, respectively). The line 302 represents the output voltage 120 provided to the comparator 106, the line 304 represents the sampling signal 128, and the line 306 represents the bit values B output by the latch 122 and used as the bits B1 and B0 of corresponding bit pairs for each of the five conversion cycles. The nomenclature $V_y[X]$ is used to identify the particular voltage $V_y$ (Y=1, 2, or R) for the corresponding conversion cycle X.

For the scaling sub-cycle (sub-cycle 1) of the initial conversion cycle 1, the voltage $V_{in}$ is doubled to generate the first voltage $V_1$ for cycle 1 (that is, $V_1[1]=2 \times V_{in}$). For the first sampling sub-cycle (sub-cycle 2) of the initial conversion cycle 1, the controller 108 asserts the sampling signal 128 (illustrated as the first pulse in line 304), thereby causing the output of the comparator 106 to be latched by the latch 122. As illustrated by chart 300, the first voltage $V_1[1]$ has a positive polarity, so the output of the comparator 106 is a "1". Accordingly, the latch 122 latches a value "1" for the first bit B1 for the bit pair [B1B0] corresponding to cycle 1. Because the first voltage $V_1[1]$ has a positive polarity, the scaling unit 102 reduces the first voltage $V_1[1]$ by the reference voltage $V_{ref}$ to generate the second voltage $V_2[1]$. For the second sampling sub-cycle (sub-cycle 3) of the initial conversion cycle 1, the controller 108 asserts the sampling signal 128 (illustrated as the second pulse in line 304), thereby causing the output of the comparator 106 to be latched by the latch 122. As illustrated by chart 300, the second voltage $V_2[1]$ also has a positive polarity, so the output of the comparator 106 is a "1". Accordingly, the latch 122 latches a value "1" for the second bit B0 for the bit pair [B1B0] corresponding to cycle 1. Because the second voltage $V_2[1]$ has a positive polarity, the scaling unit 102 reduces the second voltage $V_2[1]$ by the reference voltage $V_{ref}$ to generate the residual voltage $V_R[2]$ that is to be used for the next conversion cycle, cycle 2, in the series.

For the scaling sub-cycle (sub-cycle 1) of the conversion cycle 2, the residual voltage $V_R[2]$ is doubled to generate the first voltage $V_i$ for cycle 2 (that is, $V_1[2]=2 \times V_R[2]$). For the first sampling sub-cycle (sub-cycle 2) of the conversion cycle 2, the controller 108 asserts the sampling signal 128 (illustrated as the third pulse in line 304), thereby causing the output of the comparator 106 to be latched by the latch 122. As illustrated by chart 300, the first voltage $V_1[2]$ has a negative polarity, so the output of the comparator 106 is a "0". Accordingly, the latch 122 latches a value "0" for the first bit B1 for the bit pair [B1B0] corresponding to cycle 2. Because the first voltage $V_1[2]$ has a negative polarity, the scaling unit 102 increases the first voltage $V_1[2]$ by the reference voltage $V_{ref}$ to generate the second voltage $V_2[2]$. For the second sampling sub-cycle (sub-cycle 3) of the conversion cycle 2, the controller 108 asserts the sampling signal 128 (illustrated as the fourth pulse in line 304), thereby causing the output of the comparator 106 to be latched by the latch 122. As illustrated by chart 300, the second voltage $V_2[2]$ also has a negative polarity, so the output of the comparator 106 is a "0". Accordingly, the latch 122 latches a value "0" for the second bit B0 for the bit pair [B1B0] corresponding to cycle 2 and the scaling unit 102 increases the second voltage $V_2[2]$ by the reference voltage $V_{ref}$ to generate the residual voltage $V_R[3]$ that is to be used for the next conversion cycle, cycle 3, in the series.

The approach described above is repeated for each of cycles 3-5 so that a sequence of bit pairs "11", "00", "11", "00", "11" is generated for the conversion operation. Using the mapping described above, this sequence of bit pairs is mapped to a sequence of code values "10", "00", "10", "00", "10". This sequence of code values then is converted to a digital value "101010", or "10101" after the LSB is dropped as overhead. This final value, which is 21 in decimal, is approximately two-thirds of the maximum range of Vmax=32 (or $2^5-1$) available for a five-bit ADC resolution.

Figure 4:
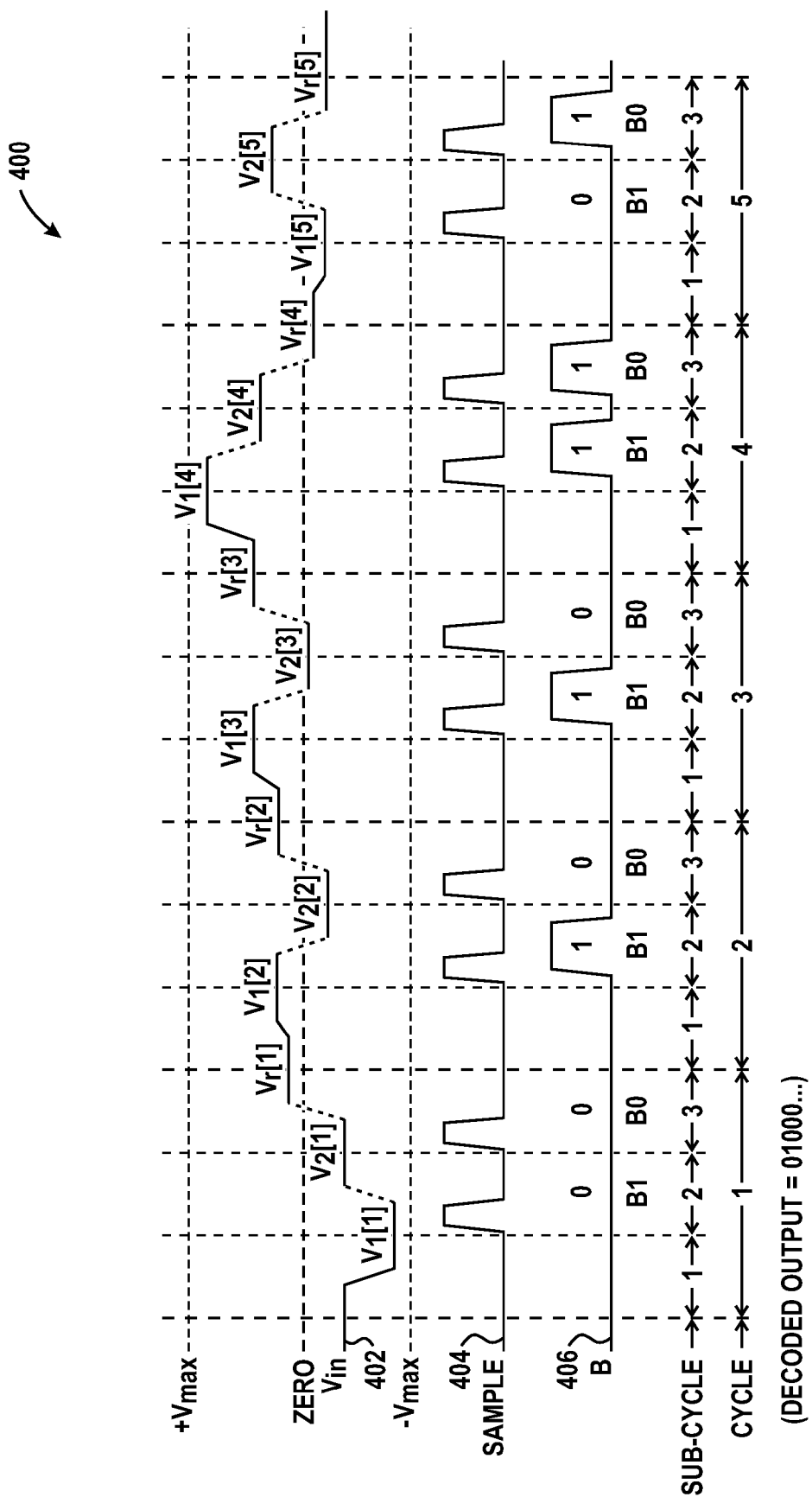
FIG. 4 is a flow diagram illustrating an example operation of the 1.5-bit algorithmic ADC of FIG. 1 for an input signal having a negative polarity in accordance with at least one embodiment of the present disclosure.

FIG. 4 illustrates another example of the method 200 in an instance whereby the voltage $V_{in}$ of the input signal 112 has a negative polarity and is approximately one-fourth of the full-scale of the ADC 100. For chart 400, the conversion process occurs over five conversion cycles, identified as "cycle 1"-"cycle 5" respectively. As depicted, each conversion cycle includes the scaling sub-cycle, the first sampling sub-cycle, and the second sampling sub-cycle (identified in chart 400 as sub-cycles 1, 2, and 3, respectively). The line 402 represents the output voltage 120 provided to the comparator 106, the line 404 represents the sampling signal 128, and the line 406 represents the bit values B output by the latch 122 and used as the bits B1 and B0 of corresponding bit pairs for each of the five conversion cycles.

For the scaling sub-cycle (sub-cycle 1) of the initial conversion cycle 1, the voltage $V_{in}$ is doubled to generate the first voltage $V_1$ for cycle 1. For the first sampling sub-cycle (sub-cycle 2) of the initial conversion cycle 1, the controller 108 asserts the sampling signal 128 (illustrated as the first pulse in line 404), thereby causing the output of the comparator 106 to be latched by the latch 122. As illustrated by chart 400, the first voltage $V_1[1]$ has a negative polarity, so the output of the comparator 106 is a "0". Accordingly, the latch 122 latches a value "0" for the first bit B1 for the bit pair [B1B0] corresponding to cycle 1. Because the first voltage $V_1[1]$ has a negative polarity, the scaling unit 102 increases the first voltage $V_1[1]$ by the reference voltage $V_{ref}$ to generate the second voltage $V_2[1]$. For the second sampling sub-cycle (sub-cycle 3) of the initial conversion cycle 1, the controller 108 asserts the sampling signal 128 (illustrated as the second pulse in line 404), thereby causing the output of the comparator 106 to be latched by the latch 122. As illustrated by chart 400, the second voltage $V_2[1]$ also has a negative polarity, so the output of the comparator 106 is a "0". Accordingly, the latch 122 latches a value "0" for the second bit B0 for the bit pair [B1B0] corresponding to cycle 1. Because the second voltage $V_2[1]$ has a negative polarity, the scaling unit 102 increases the second voltage $V_2[1]$ by the reference voltage $V_{ref}$ to generate the residual voltage $V_R[2]$ that is to be used for the next conversion cycle, cycle 2, in the series.

For the scaling sub-cycle (sub-cycle 1) of the conversion cycle 2, the residual voltage $V_R[2]$ is doubled to generate the first voltage $V_1$ for cycle 2 (that is, $V_1[2]=2\times V_R[2]$). For the first sampling sub-cycle (sub-cycle 2) of the conversion cycle 2, the controller 108 asserts the sampling signal 128 (illustrated as the third pulse in line 404), thereby causing the output of the comparator 106 to be latched by the latch 122. As illustrated by chart 300, the first voltage $V_1[2]$ has a positive polarity, so the output of the comparator 106 is a "1". Accordingly, the latch 122 latches a value "1" for the first bit B1 for the bit pair [B1B0] corresponding to cycle 2. Because the first voltage $V_1[2]$ has a positive polarity, the scaling unit 102 decreases the first voltage $V_1[2]$ by the reference voltage $V_{ref}$ to generate the second voltage $V_2[2]$. For the second sampling sub-cycle (sub-cycle 3) of the conversion cycle 2, the controller 108 asserts the sampling signal 128 (illustrated as the fourth pulse in line 404), thereby causing the output of the comparator 106 to be latched by the latch 122. As illustrated by chart 400, the second voltage $V_2[2]$ also has a negative polarity, so the output of the comparator 106 is a "0". Accordingly, the latch 122 latches a value "0" for the second bit B0 for the bit pair [B1B0] corresponding to cycle 2 and the scaling unit 102 increases the second voltage $V_2[2]$ by the reference voltage $V_{ref}$ to generate the residual voltage $V_R[3]$ that is to be used for the next conversion cycle, cycle 3, in the series.

The approach described above is repeated for each of cycles 3-5, so that a sequence of bit pairs "00", "10", "10", "11", "01" is generated for the conversion operation. Using the mapping described above, this sequence of bit pairs is mapped to a sequence of code values "00", "01", "01", "10", "01". This sequence of code values then is converted to a digital value "010001", or "01000" after dropping the LSB as overhead. This final value, which is 8 in decimal, is approximately two-thirds of the maximum range of Vmax=32 (or $2^5-1$) available for a five-bit ADC resolution.

Another aspect of the present disclosure includes a computer readable memory storing data representative of a set of instructions that when executed are adapted to facilitate the design of hardware to implement the analog-to-digital conversion techniques described above. As such, devices implementing the techniques described above may be embodied in software disposed, for example, in a computer usable (e.g., readable) medium configured to store the software (e.g., a computer readable program code). The program code causes the enablement of embodiments of the present disclosure, including the fabrication of the systems and methods disclosed herein. For example, this can be accomplished through the use of general programming languages (such as C or C++), hardware description languages (HDL) including Verilog, Verilog-A, HDL, VHDL, Altera HDL (AHDL) and so on, or other available programming and/or schematic capture tools (such as circuit capture tools). The program code can be disposed in any known computer usable medium including semiconductor, magnetic disk, optical disk (such as CD-ROM, DVD-ROM). It is understood that the functions accomplished and/or structure provided by the systems and techniques described above can be represented in a core (such as a GPU core) that is embodied in program code and may be transformed to hardware as part of the production of integrated circuits.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. In an analog-to-digital converter, a method to convert an input voltage to a corresponding digital value, the method comprising:
   performing a series of conversion cycles initiated with the input voltage to generate a sequence of bit pairs, each conversion cycle comprising scaling a residual voltage from a previous conversion cycle in the series to generate a first voltage for the conversion cycle, providing a first bit of a corresponding bit pair based on a polarity of the first voltage, generate a second bit of the corresponding bit pair based on a polarity of a second voltage, the second voltage based on the first voltage and a reference voltage, and generate the residual voltage used by a next conversion cycle in the series based on the second voltage and the reference voltage.

2. The method of claim 1, wherein the input voltage comprises the residual voltage used for an initial conversion cycle of the series.

3. The method of claim 1, wherein:
providing the first bit of the corresponding bit pair comprises providing a first bit value as the first bit responsive to the first voltage having a positive polarity and providing a second bit value as the first bit responsive to the first voltage having a negative polarity; and
providing the second bit of the corresponding bit pair comprises providing the first bit value as the second bit responsive to the second voltage having a positive polarity and providing the second bit value as the second bit responsive to the second voltage having a negative polarity.

4. The method of claim 1, further comprising:
increasing the first voltage by the reference voltage to generate the second voltage responsive to the first voltage having a negative polarity and decreasing the first voltage by the reference voltage to generate the second voltage responsive to the first voltage having a positive polarity; and
increasing the second voltage by the reference voltage to generate the residual voltage responsive to the second voltage having a negative polarity and decreasing the second voltage by the reference voltage to generate the residual voltage responsive to the second voltage having a positive polarity.

5. The method of claim 1, wherein:
the polarity of the first voltage and the polarity of the second voltage are determined using a single comparator.

6. The method of claim 1, further comprising:
generating the digital values based on the sequence of bit pairs.

7. The method of claim 6, wherein generating the digital value based on the sequence of bit pairs comprises:
mapping each bit pair to a corresponding two-bit digital code to generate a sequence of digital codes; and
performing exclusive-OR operations using the sequence of digital codes to generate the digital value.

8. A computer readable medium to store a set of instructions, wherein the set of instructions comprises hardware description language (HDL) instructions configured to determine a design of the analog-to-digital converter to implement the method of claim 1.

9. A 1.5-bit algorithmic analog-to-digital converter to implement a series of conversion cycles for converting an input voltage to a digital value, the analog-to-digital converter comprising:
a scaling unit comprising an input to receive the input voltage, an input to receive a reference voltage and an output to provide an output voltage;
a comparator having an input to receive the output voltage and an output to provide a select one of a first bit value or a second bit value for a corresponding bit pair based on a polarity of the output voltage; and
a code conversion unit to generate the digital value based on a sequence of bit pairs output by the comparator for the series of conversion cycles.

10. The analog-to-digital converter of claim 9, further comprising:
a controller to control the scaling unit for the series of conversion cycles, wherein for each conversion cycle, the controller is to control the scaling unit to scale a residual voltage from a previous conversion cycle in the series so as to provide a first voltage as the output voltage, to provide a second voltage as the output voltage based on the first voltage, the reference voltage and a polarity of the first voltage, and to provide the residual voltage used by a next conversion cycle in the series as the output voltage based on the second voltage, the reference voltage, and a polarity of the first voltage, whereby the comparator provides a first bit of a bit pair corresponding to the conversion cycle based on the polarity of the first voltage and the comparator provides a second bit of the bit pair corresponding to the conversion cycle based on the polarity of the second voltage.

11. The analog-to-digital converter of claim 10, wherein the input voltage comprises the residual voltage used for an initial conversion cycle of the series.

12. The analog-to-digital converter of claim 10, wherein the code conversion unit is to map the bit pairs of the sequence to corresponding two-bit digital codes and to perform exclusive-OR operations using the digital codes to generate the digital value.

13. A computer readable medium to store a set of instructions, wherein the set of instructions comprises hardware description language (HDL) instructions configured to determine a design of the analog-to-digital converter of claim 9.

14. The analog-to-digital converter of claim 10, wherein the controller is to control the scaling unit to:
increase the first voltage by the reference voltage to generate the second voltage responsive to the first voltage having a negative polarity or decrease the first voltage by the reference voltage to generate the residual voltage responsive to the first voltage having a positive polarity; and
increase the second voltage by the reference voltage to generate the residual voltage responsive to the second voltage having a negative polarity or decrease the second voltage by the reference voltage to generate the residual voltage responsive to the second voltage having a positive polarity.

15. The analog-to-digital converter of claim 9, wherein the scaling unit comprises:
a switched-capacitor integrator unit comprising an input to receive the input voltage, an input to receive a feedback voltage, and an output to provide the output voltage, wherein the switched-capacitor integrator adjusts the output voltage based on the second input voltage;
a sample-and-hold buffer comprising an input to receive the output voltage and an output to provide a buffered representation of the output voltage; and
a multiplexing unit comprising an input to receive the output voltage from the sample-and-hold buffer, an input to receive the reference voltage, and an output to provide as the feedback voltage a select one of the output voltage, the reference voltage at a positive polarity, or the reference voltage at a negative polarity.

16. In an analog-to-digital converter, a method for converting an input voltage to a corresponding digital value, the method comprising:
for each conversion cycle of a series of conversion cycles:
scaling a residual voltage from a previous conversion cycle to generate a first voltage of the conversion cycle;
selectively providing one of a first bit value or a second bit value for a first bit of a bit pair of the conversion cycle based on a polarity of the first voltage;

selectively increasing or decreasing the first voltage by a reference voltage responsive to the polarity of the first voltage to generate a second voltage of the conversion cycle;

selectively providing one of the first bit value or the second bit value for a second bit of the bit pair for the conversion cycle based on a polarity of the second voltage; and selectively increasing or decreasing the second voltage by the reference voltage responsive to the polarity of the second voltage to generate a residual voltage for use by the next conversion cycle in the series.

17. The method of claim 16, further comprising:
generating the digital value based on the bit pairs from the series of conversion cycles.

18. The method of claim 16, wherein:
selectively increasing or decreasing the first voltage by the reference voltage comprises increasing the first voltage by the reference voltage to generate the second voltage responsive to the first voltage having a negative polarity and decreasing the first voltage by the reference voltage to generate the second voltage responsive to the first voltage having a positive polarity; and selectively increasing or decreasing the second voltage by the reference voltage comprises increasing the second voltage by the reference voltage to generate the residual voltage responsive to the second voltage having a negative polarity and decreasing the second voltage by the reference voltage to generate the residual voltage responsive to the second voltage having a positive polarity.

19. The method of claim 16, wherein:
the polarity of the first voltage and the polarity of the second voltage are determined using a single comparator.

20. A computer readable medium to store a set of instructions, wherein the set of instructions comprises hardware description language (HDL) instructions configured to determine a design of the analog-to-digital converter to implement the method of claim 16.

* * * * *